(12) United States Patent
Lin et al.

(10) Patent No.: US 6,211,057 B1
(45) Date of Patent: Apr. 3, 2001

(54) METHOD FOR MANUFACTURING ARCH AIR GAP IN MULTILEVEL INTERCONNECTION

(75) Inventors: Shih-Chi Lin, Taipei; Yen-Ming Chen, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/389,887

(22) Filed: Sep. 3, 1999

(51) Int. Cl.$^7$ ................................................ H01L 21/4763
(52) U.S. Cl. ................. 438/619; 438/624; 438/631; 438/633; 438/634; 438/637; 438/756; 438/757
(58) Field of Search ........................ 438/619, 624, 438/631, 633, 634, 637, 756, 757

(56) References Cited

U.S. PATENT DOCUMENTS

| | | | |
|---|---|---|---|
| 3,689,992 | | 9/1972 | Schutze et al. ............... 29/577 |
| 5,310,700 | * | 5/1994 | Lien et al. ................... 438/619 |
| 5,324,683 | | 6/1994 | Fitch et al. ................... 437/65 |
| 5,407,860 | | 4/1995 | Stoltz et al. ................. 437/180 |
| 5,444,015 | * | 8/1995 | Aitken et al. ................ 438/619 |
| 5,461,003 | | 10/1995 | Havemann et al. .......... 437/187 |
| 5,510,645 | * | 4/1996 | Fitch et al. ................... 257/522 |
| 5,641,712 | | 6/1997 | Grivna et al. ................ 438/624 |
| 5,750,415 | | 5/1998 | Gnade et al. ................. 437/195 |
| 5,759,913 | * | 6/1998 | Fulford, Jr. et al. .......... 438/624 |
| 5,814,555 | * | 9/1998 | Bandyopadhyay et al. .... 438/619 |
| 5,837,618 | * | 11/1998 | Avanzino et al. ............ 438/624 |
| 5,924,006 | * | 7/1999 | Lur et al. ..................... 438/633 |
| 5,932,490 | * | 8/1999 | Manning ....................... 438/619 |
| 5,949,143 | * | 9/1999 | Bang ............................ 257/758 |
| 6,025,260 | * | 2/2000 | Lien et al. .................... 438/619 |
| 6,054,381 | * | 4/2000 | Okada .......................... 438/624 |
| 6,071,805 | * | 6/2000 | Liu ............................... 438/619 |
| 6,077,767 | * | 6/2000 | Hwang ......................... 438/619 |
| 6,093,633 | * | 7/2000 | Matsumoto ................... 438/624 |
| 6,130,151 | * | 10/2000 | Lin et al. ...................... 438/619 |

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

In accordance with the objectives of the invention a new method of forming air gaps between adjacent conducting lines of a semiconductor circuit is achieved. A pattern of metal lines is deposited over an insulating layer. A layer of oxynitride (SiON) is deposited over the pattern of metal lines and the exposed surface of the insulating layer. PECVD oxide is deposited over the layer of oxynitride; the PECVD oxide is removed down to the top surface of the layer of oxynitride overlying the metal pattern. A layer of SOON is deposited over the surface of the polished oxynitride and the polished PECVD oxide. A trench is etched between the conducting line pattern through the layer of SOON and into the PECVD oxide. The profile of this trench is aggressively expanded converting the trench profile from a rectangular profile into an arch-shaped profile. The top region of the arch-shaped profile is closed off by depositing a layer of dielectric over the surface of the layer of SOON.

9 Claims, 2 Drawing Sheets

METHOD FOR MANUFACTURING ARCH AIR GAP IN MULTILEVEL INTERCONNECTION

BACKGROUND OF THE INVENTION (1) Field of the Invention

The invention relates to the fabrication of integrated circuit devices, and more particularly, to a method of creating (arch-shaped) air gaps as a low dielectric constant material between conductor lines.

(2) Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The intra-dielectric material that is typically used to isolate conducting lines from each other is silicon dioxide, which is a thermally and chemically stable material. Continued decreasing of the horizontal dimensions of semiconductor devices leads to layers of metal that tend to have vertical dimensions that are not necessarily reduced accordingly resulting for instance in contact and via openings that have a high aspect ratio. Conventional oxide etching processes and materials are however available for such high aspect ratio contact and via openings. The dielectric constant of dense silicon oxide that is grown by thermal oxidation or by chemical vapor deposition is in the order of 3.9, CVD oxide has a relative dielectric constant of about 4.6. The lowest possible and therefore the ideal dielectric constant is 1.0, this is the dielectric constant of a vacuum whereas air has a dielectric constant of slightly larger than 1.0. Dielectric constants of dielectric materials that can be used for intra-level or inter level dielectric material vary, typical values are for instance 4.1–4.5 for inorganic Plasma $SiO_2$, 3.5 for inorganic fluorine doped $SiO_2$ (FSG), 2.7–3.0 for Organic Polysilsequioxane (Si polymer), 2.7 for organic Bemzocyclobutene (BCB), etc.

The continuing effort to reduce the size of individual transistors and other devices commonly integrated on a semiconductor chip and to increase the density of Integrated Circuits results in a continuing reduction of the separation between conducting layers of materials. As the spacing between interconnect line patterns is reduced to the micron or sub-micron range, the parasitic intra-level capacitance between the lines increases. This increase in intra-level capacitance coupling results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation while limiting the speed at which the device can operate. In many applications, the intra-level capacitance of the interconnect line pattern has become the limiting factor that determines the speed of gallium arsenide or silicon Integrated Circuits. It becomes therefore imperative to reduce the resistance-capacitance (RC) time constant and the crosstalk between adjacent conducting lines.

The intra-level capacitance between adjacent conducting lines is highly dependent on the insulator or dielectric used to separate the conducting lines. With the use of continuously decreasing line spacing between conducting lines, the low dielectric constants of the dielectric materials that are used are frequently not low enough to adequately off-set the effects of the decreased line spacing. In addition, the use of many of the low dielectric constant materials is not feasible due to the fact that equipment is not available to properly process the new dielectric materials in various integrated circuits. Also, the chemical or physical properties of many low dielectric constant materials are usually difficult to make compatible with or integrate into conventional integrated circuit processing. The resulting interconnect structures may also reduce the efficiency of heat dissipation due to the fact that materials that have lower dielectric constants generally have lower thermal conductivity. Decreased spacing between lines in interconnect patterns may further cause concerns of reliability of the device due to such issues as electromigration, extremely high current density, failures of the wire pattern to adhere to underlying layers, the creation of mechanical stress patterns, etc.

To reduce the capacitive coupling and to thereby reduce capacitive crosstalk, a major objective in the design of IC's is to reduce the Dielectric Constant (k) of the insulating layer between adjacent conductor lines of semiconductor circuits. The invention provides a method that introduces the use of an arch-shaped air gap between the interconnect lines.

U.S. Pat. No. 5,324,683 (Fitch et al.) teaches the formation of an air (FIGS. 13 to 17). The layers in Fitch differ in composition from the invention. This is close to the invention.

U.S. Pat. No. 3,689,992 (Schutze et al.) shows an air gap process using an etch back.

U.S. Pat. No. 5,750,415 (Gnade et al.) and U.S. Pat. No. 5,461,003 (Havemann et al.) show an air gap process using low-porosity silica film.

U.S. Pat. No. 5,641,712 (Grivna et al.) teaches an air gap process using a special deposition process.

U.S. Pat. No. 5,407,860 (Stoltz et al.) recites an air gap method using an etch back process.

SUMMARY OF THE INVENTION

The principle object of the present invention is to provide method of forming air gaps between conductive layers of material.

Another objective of the present invention is a method of reducing the dielectric constant k between conductive layers of material.

Another objective of the present invention is a method of reducing capacitive coupling between conductive layers of material.

Another objective of the present invention is a method of reducing capacitive crosstalk between conductive layers of material.

Another objective of the present invention is to reduce the potential for false or incorrect logic levels of the circuits in the IC's.

Another objective of the present invention is a method of reducing Resistance Capacitance delays of the circuits in the IC's.

Another objective of the present invention is to increase Switching Speed of the circuits in the IC's.

In accordance with the objectives of the invention a new method of forming air gaps between adjacent conducting lines of a semiconductor circuit is achieved. A pattern of metal lines is deposited on an insulating layer. A layer of oxynitride (SiON) is deposited over the pattern of metal lines and the exposed surface of the insulating layer. PECVD oxide is deposited over the layer of oxynitride; the PECVD oxide is removed (using CMP techniques) down to the top surface of the layer of oxynitride overlying the metal pattern. A layer of SOON is deposited over the surface of the polished oxynitride and the polished PECVD oxide. A trench is etched between the conducting line pattern through the layer of SOON and into the top region of the layer of PECVD oxide. The profile of this trench is aggressively expanded (with a wet etch) so that the trench profile will be converted from a rectangular profile into an arch-shaped profile. The top region of the arch-shaped profile is closed off by depositing a layer of dielectric over the surface of the layer of SOON.

DESCRIPTION OF THE PREFERRED EMBODIMENTS

Figure 1:
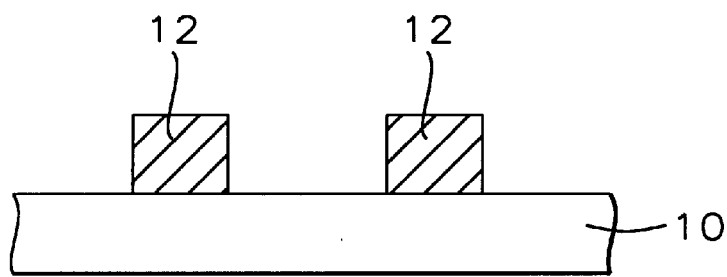
FIG. 1 shows a cross section of the insulating layer and the metal interconnect pattern formed thereon.

Referring now specifically to FIG. 1, there is shown a cross-section of the insulating layer 10 and the metal interconnect pattern 12 formed thereon. A base layer or gate oxide layer or any other insulating layer can be used for layer 10 which illustrates that the present invention of forming air gaps between adjacent conducting lines of a semiconductor circuit may be applied on any level within the integrated circuit.

In the preferred form, interconnect pattern 12 is a pattern of conductive lines using materials such as metal, a silicate, a salicide, poly silicon, amorphous silicon or any other semiconductor compatible conductive layer. The cross-section shown in FIG. 1 indicates any level of conducting lines that needs to be isolated and is etched in a predetermined pattern to form conducting leads.

Typical insulating materials can be used for layer 10 such as silicon oxide and oxygen-containing polymers. Typical insulator deposition uses LPCVD or APCVD at a temperature between about 400 and 500 degrees C. or PECVD at a temperature between about 300 and 450 degrees C. whereby the insulator material is deposited to a thickness of between about 2000 and 10000 Angstrom.

The method of deposition of the metal leads 12 uses standard PVD techniques that are well known in the art of semiconductor manufacturing. Where, as an example, the interconnect metalization layer is aluminum, containing between about 1.0 and 3.0% copper, and between about 0.5 and 2.0% silicon, this metalization layer is deposited using rf sputtering at a temperature between about 100 and 400 degrees C. to a thickness between about 4000 and 11000 Angstrom.

Figure 2:
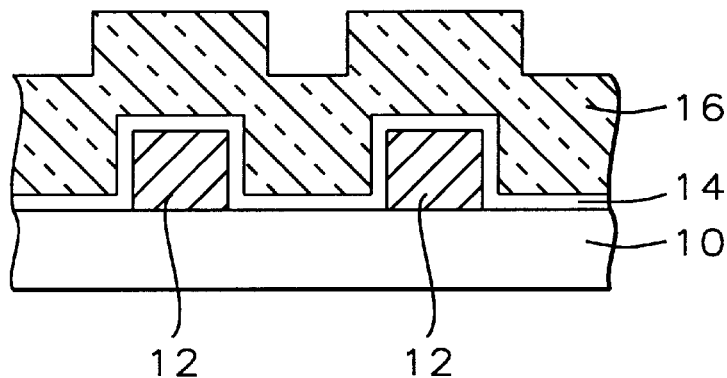
FIG. 2 shows a cross section of the pattern of FIG. 1 after the deposition of a layer of oxynitride and the deposition of a layer of PECVD oxide.

FIG. 2 shows a cross section of the pattern of FIG. 1 after the deposition of a layer 14 of oxynitride and the deposition of a layer 16 of PECVD oxide. The method of deposition for these two layers 14 and 16 uses standard CVD techniques. The layer 14 of oxynitride serves as a stop layer during subsequent processing steps when a created trench is expanded to the arch-shaped profile of the invention.

Layer 14 of oxynitride is typically deposited to a thickness of about 500 Angstrom. The deposition of the layer 14 of oxynitride uses $SiH_4+N_2O+N_2$ or $SiH_4+NH_3+N_2O$ as a source, using the CVD process at a temperature between about 300 and 450 degrees C. and a pressure between about 0.8 and 4 Torr.

Layer 16 of $SiO_2$ is typically deposited using $SiH_4+N_2O$ as the source, using the PECVD process at a temperature between about 300 and 450 degree C. and a pressure between about 0.8 and 4 Torr.

Figure 3:
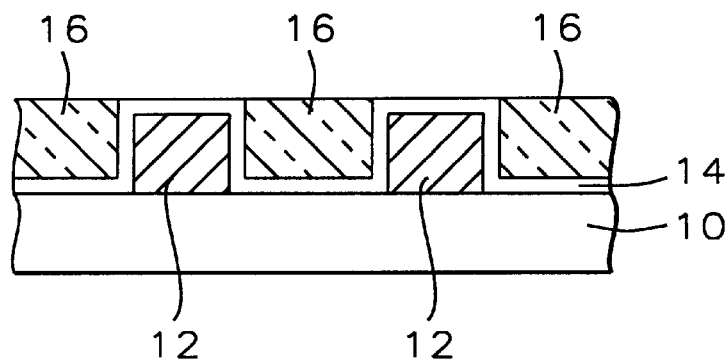
FIG. 3 shows a cross section of the pattern of FIG. 2 after the layer of PECVD oxide has been removed down to the top surface of the layer of oxynitride.

FIG. 3 shows a cross section of the metal interconnect pattern after the layer 16 of PECVD oxide has been removed down to the top surface of the layer 14 of oxynitride. This process of removal of the layer 16 above the surface of the layer of oxynitride is a CMP process that uses the top surface of the oxynitride as the stop layer.

Figure 4:
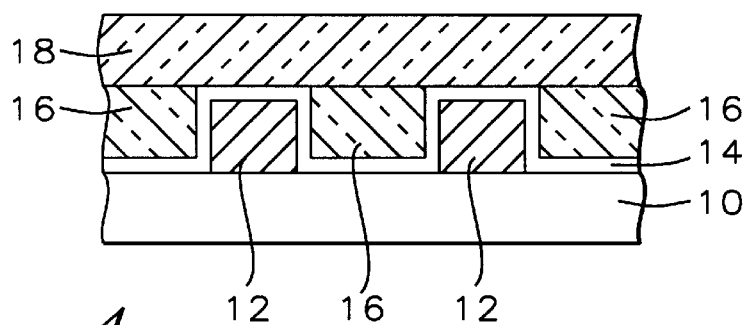
FIG. 4 shows a cross section of the pattern of FIG. 3 after the deposition of a layer of SOON over the layer of polished PECVD oxide and oxynitride.

FIG. 4 shows a cross section of the metal pattern after a layer 18 of SOON has been deposited over the surface of the polished layer 16 of CVD oxide. This layer is deposited to a thickness of between about 4000 and 6000 Angstrom which is the thickness that is required to enable the formation of the trench through this layer as highlighted in the following processing steps.

The composition of the layer of SOON changes when going from the bottom to the top of the deposited layer of SOON from $SiO_2$ (which is in contact with the underlying layer 16 of PECVD $SiO_2$ and the top surface of the layer 14 of oxynitride), followed by SiON. The process starts by depositing $SiH_4$ with $N_2O$ thereby forming the layer of $SiO_2$ immediately over the surface of layer 16 of PECVD $SiO_2$. To this deposition mixture is added a flow of $NH_3$ in a linear with time increasing manner thereby creating the required composition.

In the formation of layer 18 a beginning layer of $SiO_2$ is formed over the surface of layer 16 that is between about 300 and 500 Angstrom thick. This layer is formed by flowing $SiH_4$ at a flow rate of about 80 sccm while at the same time flowing $N_2O$ at a flow rate of about 3000 sccm. The processing temperature is between about 300 and 400 degrees C. with a pressure of between about 800 and 1600 mTorr. The flow rate of the $NH_3$ is increased as a linear function of time from 0 to about 1900 sccm, the $NH_3$ and the $N_2O$ continue to flow while the $NH_3$ flows. During this latter flow, the flow rate of the $SiH_4$ is increased from 80 to about 320 sccm with increasing thickness of the layer while the flow rate of the $N_2O$ is decreased from about 3000 sccm to about 2000 sccm. The processing parameters such as temperature and pressure remain constant during this combined process of flow.

Figure 5:
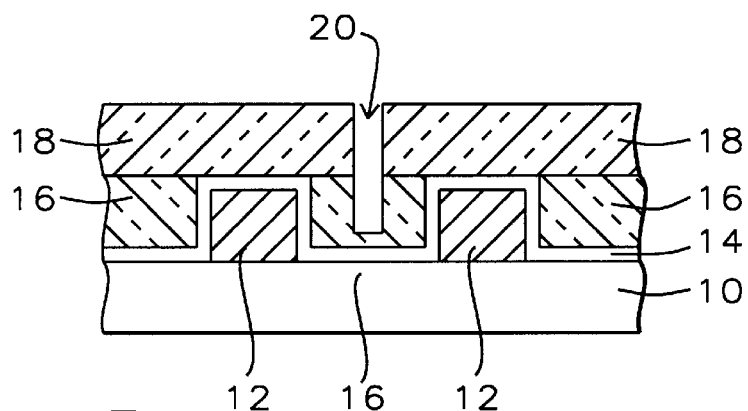
FIG. 5 shows a cross section of the pattern of FIG. 4 after a trench has been formed in the layer of SOON and into the top region of layer of PECVD oxide.

FIG. 5 shows the etching of trench 20 that located centered between the interconnect pattern 12 and is (RIE) etched through layer 18 of SOON and deep into the layer 16 of PECVD $SiO_2$ that is present in between the interconnect metal pattern 12.

Figure 6:
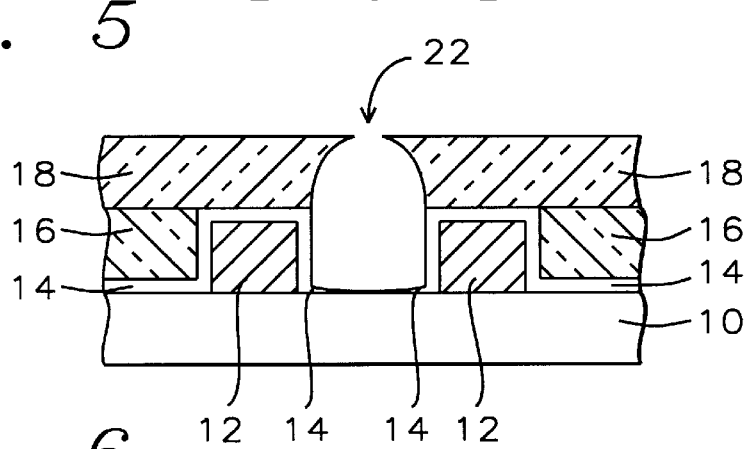
FIG. 6 shows a cross section of the pattern of FIG. 5 after the trench profile has been expanded into an arch-shaped profile.

FIG. 6 shows a cross section of the interconnect pattern after the trench has been expanded to an arch-shaped profile 22. The etch that is applied for this purpose is a wet HF etch with an etch composition of from 1% to 10% HF, 100 $H_2O$ to 1 HF (with a 49% HF solution) to 100 $H_2O$ to 10 HF (also with a 49% HF solution). The indicated etch rate is required in order to remove enough of the SOON (of layer 18) and the CVD oxide (of layer 16) to create the indicated arch-shaped profile.

The formation of the trench 20 uses a wet etch process and applies a HF mixture as the etchant with the HF mixture content between about 1% and 10% and a temperature of about 60 degrees C.

Figure 7:
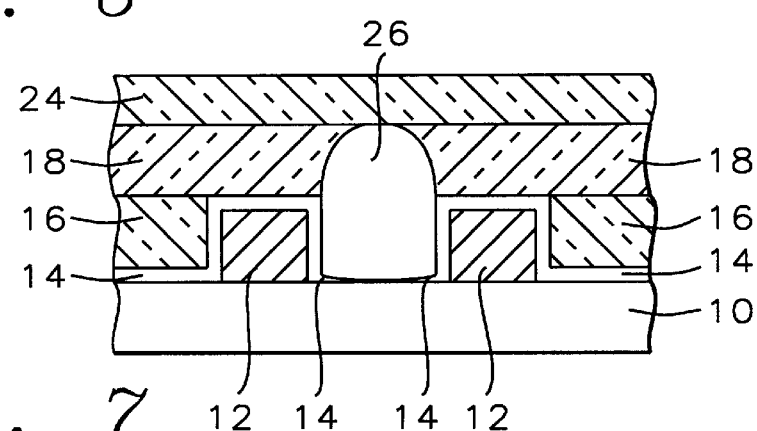
FIG. 7 shows a cross section of the pattern of FIG. 6 after the deposition of a layer of dielectric.

FIG. 7 shows a cross section of the interconnect line pattern after a low step layer 24 of dielectric has been deposited over the surface of the layer 18 of SOON and the entrance to the arch-shaped cavity 22. The intra-level gap 26 of the invention is now complete. The dielectric layer can for instance contain silicon oxide, deposited using either PECVD or APCVD processing, at a temperature between about 300 to 450 degrees C. to a thickness between about 3000 to 5000 Angstrom.

The dielectric liner does not penetrate through the top opening of the arch-shaped opening and into the spaces between the conducting lines 12 as long as the processing temperature used for the deposition of the layer of dielectric remains below the melting point of the dielectric.

Although the invent ion has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming air gaps in between metal lines of a semiconductor device, comprising the steps of:

providing a semiconductor substrate;

depositing an insulating layer over the surface of said substrate;

depositing a layer of metal over the surface of said insulating layer;

etching said metal layer in a pattern to form metal leads, said metal leads having tops, wherein portions of said insulating layer remain exposed;

depositing a layer of oxynitride over said metal leads and said exposed portions of said insulating layer;

depositing a layer of CVD oxide over the surface of said layer of oxynitride;

polishing said CVD oxide down to the top surface of said layer of oxynitride thereby leaving said CVD oxide in place between said metal leads;

depositing a layer of SOON over the surface of said polished CVD oxide and the top surface of said oxynitride;

forming a trench in between the pattern of said metal leads said trench to penetrate through said layer of SOON and into said CVD oxide;

performing a HF solution wet-etch of said layer of SOON and said polished CVD oxide thereby expanding said trench into an arch-like cavity; and depositing a layer of dielectric over said layer of SOON thereby including said arch-like cavity.

2. The method of claim 1 wherein said insulating layer contains silicon oxide or an oxygen-containing polymer deposited using LPCVD or APCVD at a temperature between about 400 and 500 degrees C. to a thickness of between about 2000 and 10000 Angstrom.

3. The method of claim 1 wherein said metal layer contains metal, a silicate, a salicide, poly silicon, amorphous silicon or any other semiconductor compatible conductive layer deposited to a thickness of between about 4000 and 11000 Angstrom.

4. The method of claim 1 wherein said depositing a layer of SOON is a sequential deposition wherein the composition of the layer of SOON varies when going from the lower portion of the deposition to the upper layer of the deposition from $SiO_2$.

5. The method of claim 1 wherein said depositing a layer of SOON starts by depositing $SiH_4$ with $N_2O$ thereby forming the layer of $SiO_2$ immediately over the surface of layer 16 of PECVD $SiO_2$ followed by the addition of a flow of $NH_3$ whereby said NH3 flow increases in a linear with time.

6. The method of claim 1 wherein said forming a trench is etching through said layer of SOON furthermore etching into the top region of said layer of CVD oxide by a measurable amount said etch creating a trench that is located in essentially the geometric center of the metal leads thereby penetrating said layer of CVD oxide in a downward direction for about 80% of its thickness.

7. The method of claim 1 wherein said expanding said trench into an arch-like cavity is a wet HF etch with a etch composition of from 1% to 10% HF, 100 $H_2O$ to 1 HF (with a 49% HF solution) to 100 $H_2O$ to 10 HF (also with a 49% HF solution).

8. The method of claim 1 wherein said depositing a layer of dielectric is depositing using either PECVD or APCVD processing at a temperature between about 300 to 450 degrees C. to a thickness between about 3000 to 5000 Angstrom.

9. A method of forming air gaps in between metal lines of a semiconductor device, comprising the steps of:

providing a semiconductor substrate;

depositing an insulating layer over the surface of said substrate said insulating layer to contain silicon oxide or an oxygen-containing polymer deposited using LPCVD or APCVD at a temperature between about 400 and 500 degrees C. to a thickness of between about 2000 and 10000 Angstrom;

depositing a layer of metal over the surface of said insulating layer said metal layer to contain metal, a silicate, a salicide, poly silicon, amorphous silicon or any other semiconductor compatible conductive layer deposited to a thickness of between about 4000 and 11000 Angstrom;

etching said metal layer in a pattern to form metal leads, said metal leads having tops, wherein portions of said insulating layer remain exposed;

depositing a layer of oxynitride over said metal leads and said exposed portions of said insulating layer;

depositing a layer of CVD oxide over the surface of said layer of oxynitride;

polishing said CVD oxide down to the top surface of said layer of oxynitride thereby leaving said CVD oxide in place between said metal leads;

depositing a layer of SOON over the surface of said polished CVD oxide and the top surface of said oxynitride said deposition is a sequential deposition wherein the composition of the layer of SOON varies when going from the lower portion of the deposition to the upper layer of the deposition from $SiO_2$ followed by SiO mixed with SN followed by SiON said depositing to start by depositing $SiH_4$ with $N_2O$ thereby forming the layer of $SiO_2$ immediately over the surface of layer 16 of PECVD $SiO_2$ followed by the addition of a flow of $NH_3$ whereby said NH3 flow increases in a linear with time;

forming a trench in between the pattern of said metal leads said trench to penetrate through said layer of SOON and into the top region of said CVD oxide thereby creating a trench that is located in essentially the geometric center of the metal leads thereby penetrating said layer of CVD oxide in a downward direction for about 80% of its thickness;

performing a HF solution wet-etch of said layer of SOON and said polished CVD oxide said etch being a wet HF etch with an etch composition of from 1% to 10% HF, 100 $H_2O$ to 1 HF (with a 49% HF solution) to 100 $H_2O$ to 10 HF (also with a 49% HF solution); and depositing a layer of dielectric over said layer of SOON thereby including said arch-like cavity said deposition using either PECVD or APCVD processing at a temperature between about 300 to 450 degrees C. to a thickness between about 3000 to 5000 Angstrom.

* * * * *